(12) United States Patent
Oh et al.

(10) Patent No.: US 11,329,260 B2
(45) Date of Patent: May 10, 2022

(54) TOUCH DISPLAY DEVICE

(71) Applicant: LG Display Co., Ltd., Seoul (KR)

(72) Inventors: Jae-Young Oh, Goyang-si (KR); Tae-Hwan Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/924,017

(22) Filed: Jul. 8, 2020

(65) Prior Publication Data

US 2021/0175476 A1  Jun. 10, 2021

(30) Foreign Application Priority Data

Dec. 5, 2019  (KR) .................. 10-2019-0160326

(51) Int. Cl.
| | |
|---|---|
| *G06F 3/045* | (2006.01) |
| *H01L 51/52* | (2006.01) |
| *H01L 27/32* | (2006.01) |
| *G06F 3/044* | (2006.01) |
| *G06F 3/041* | (2006.01) |

(52) U.S. Cl.
CPC ........ *H01L 51/5284* (2013.01); *G06F 3/0446* (2019.05); *G06F 3/04164* (2019.05); *H01L 27/322* (2013.01); *H01L 27/323* (2013.01); *H01L 27/3246* (2013.01)

(58) Field of Classification Search
CPC . G06F 3/04164; G06F 3/0446; H01L 27/322; H01L 27/323; H01L 27/3246; H01L 51/5284
See application file for complete search history.

(56) References Cited

U.S. PATENT DOCUMENTS

| | | | |
|---|---|---|---|
| 2015/0226992 A1* | 8/2015 | Ro | H01L 29/66765 438/29 |
| 2016/0117031 A1* | 4/2016 | Han | G06F 3/0443 345/174 |
| 2018/0342560 A1* | 11/2018 | Ma | G06F 3/0445 |
| 2019/0115411 A1* | 4/2019 | Park | H01L 51/524 |

FOREIGN PATENT DOCUMENTS

| | | |
|---|---|---|
| KR | 20060102446 A | 9/2006 |
| KR | 20150050475 A | 5/2015 |
| KR | 101834792 B1 | 3/2018 |
| KR | 10-2018-0074980 A | 7/2018 |
| KR | 10-2019-0048391 A | 5/2019 |
| KR | 20190048572 A | 5/2019 |
| KR | 20190064197 A | 6/2019 |
| KR | 10-2019-0078989 A | 7/2019 |

\* cited by examiner

*Primary Examiner* — Insa Sadio
(74) *Attorney, Agent, or Firm* — Seed IP Law Group LLP (57) ABSTRACT

A touch display device exhibiting low reflectivity is disclosed. The touch display device includes a light-blocking stack composed of at least two light-blocking color layers overlapping a plurality of touch electrodes disposed on an encapsulation unit, and a low-reflection layer disposed on the light-blocking stack, thereby absorbing external light without a separate polarizing plate, thus exhibiting low reflectivity.

16 Claims, 8 Drawing Sheets

TOUCH DISPLAY DEVICE

CROSS-REFERENCE TO RELATED APPLICATION

This application claims the benefit of Korean Patent Application No. 2019-0160326, filed on Dec. 5, 2019, which is hereby incorporated by reference as if fully set forth herein.

BACKGROUND

Technical Field

The present disclosure relates to a touch display device, and more particularly to a touch display device exhibiting low reflectivity.

Description of the Related Art

A touch screen is an input device through which a user may input a command by selecting instructions displayed on a screen of a display device using a hand or an object. That is, a touch screen converts a contact position that directly contacts a human hand or an object into an electrical signal and receives selected instructions based on the contact position as an input signal. Such a touch screen may substitute for a separate input device that is connected to a display device and operated, such as a keyboard or a mouse, and thus the range of application of the touch screen is continually increasing.

A touch screen includes a plurality of touch electrodes formed of an opaque material. A polarizing plate is disposed on the touch screen in order to prevent deterioration in visibility due to reflection of light incident from outside by the touch electrodes formed of the opaque material. However, the polarizing plate incurs an increase in the thickness of a product, an increase in manufacturing costs, and a decrease in transmissivity.

BRIEF SUMMARY

Accordingly, in some embodiments of the present disclosure, a touch display device that substantially obviates one or more problems due to limitations and disadvantages of the related art is provided.

The present disclosure provides a touch display device exhibiting low reflectivity.

Additional advantages, technical benefits, and features of the disclosure will be set forth in part in the description which follows and in part will become apparent to those having ordinary skill in the art upon examination of the following or may be learned from practice of the disclosure. The benefits and other advantages of the disclosure may be realized and attained by the structure particularly pointed out in the written description and claims hereof as well as the appended drawings.

To achieve these benefits and other advantages and in accordance with the purpose of the disclosure, as embodied and broadly described herein, a touch display device includes a light-blocking stack composed of at least two light-blocking color layers overlapping a plurality of touch electrodes disposed on an encapsulation unit, and a low-reflection layer disposed on the light-blocking stack, thereby absorbing external light without a separate polarizing plate, thus exhibiting low reflectivity.

It is to be understood that both the foregoing general description and the following detailed description of the present disclosure are examples and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the one or more embodiments of the present disclosure, examples of which are illustrated in the accompanying drawings.

Figure 1:
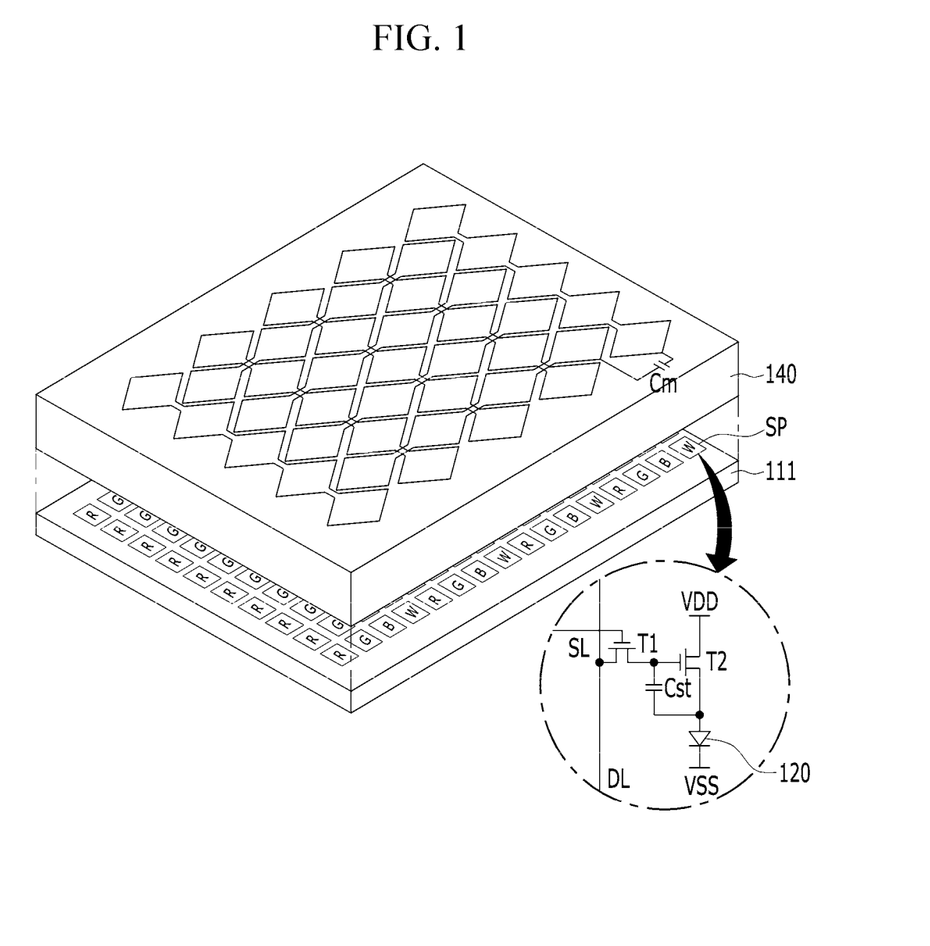
FIG. 1 is a perspective view showing a touch display device according to the present disclosure.

FIG. 1 is a perspective view of a touch display device according to the present disclosure.

Figure 2:
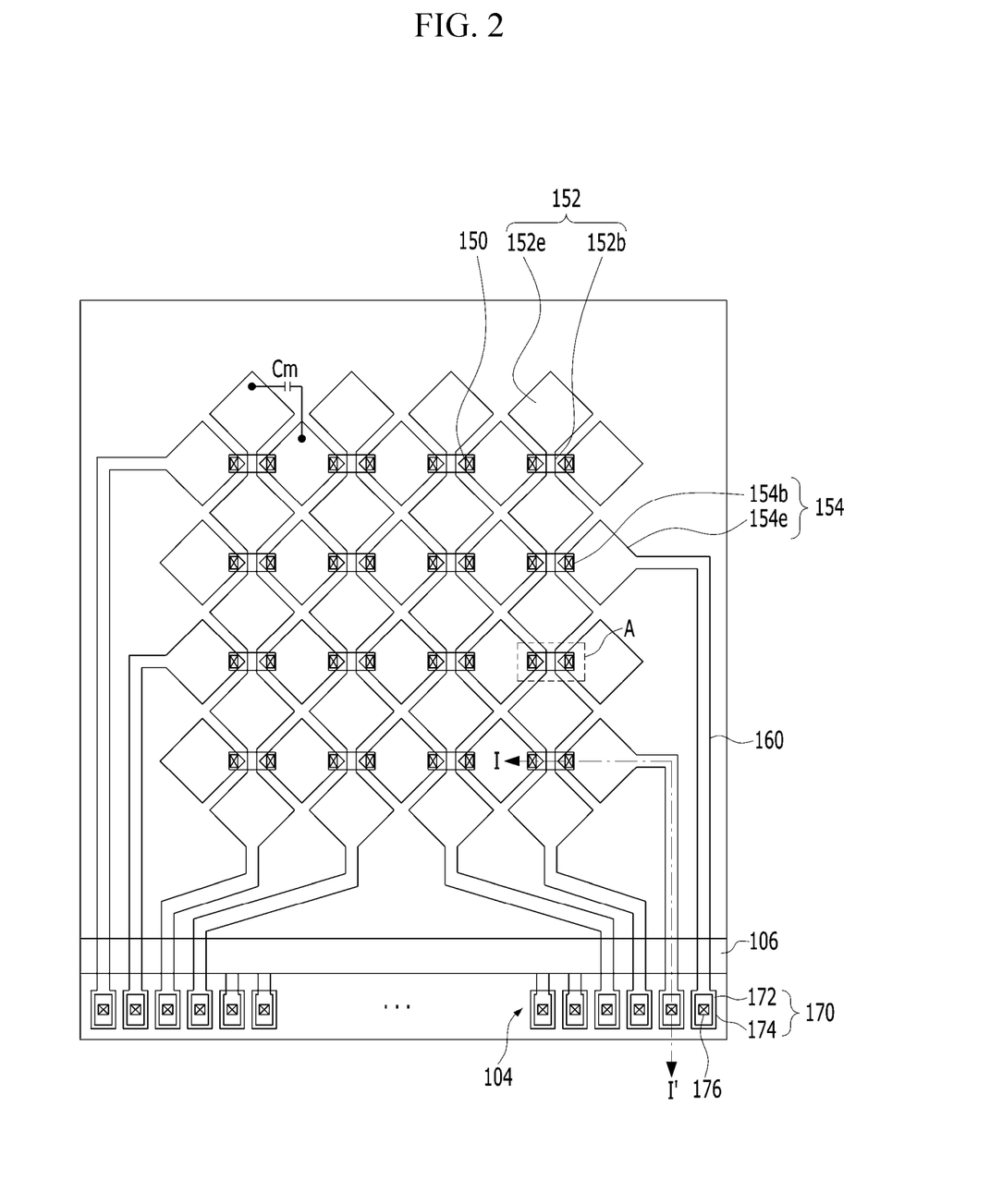
FIG. 2 is a plan view showing a touch display device according to a first embodiment of the present disclosure.

A touch display device shown in FIG. 1 senses the presence or absence of a touch and a touch position by sensing a variation in mutual capacitance Cm (e.g., a touch sensor) in response to a user touch through touch electrodes 152e and 154e shown in FIG. 2 for a touch period. An organic light-emitting display device having the touch sensor shown in FIG. 1 displays an image through a unit pixel UP (refer to FIG. 3) including a light-emitting element 120.

To this end, the touch display device includes a unit pixel UP composed of a plurality of subpixels SP arranged in a matrix form on a substrate 111, an encapsulation unit 140 disposed on the plurality of subpixels SP, and a touch sensor Cm disposed on the encapsulation unit 140.

Figure 3:
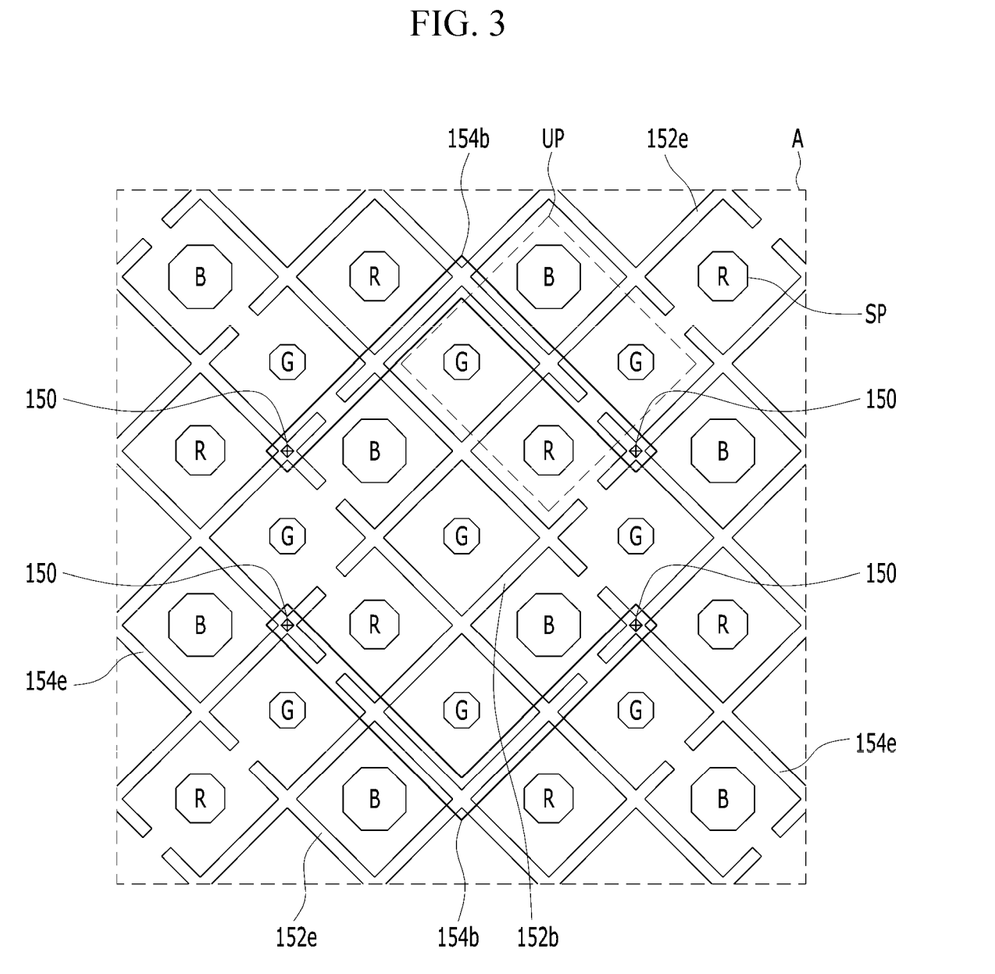
FIG. 3 is an enlarged plan view of region A in FIG. 2.

The unit pixel UP is composed of red (R), green (G) and blue (B) subpixels SP, which are arranged in a row. Alternatively, as shown in FIG. 1, the unit pixel UP is composed of red (R), green (G), blue (B) and white (W) subpixels SP. Alternatively, as shown in FIG. 3, the unit pixel UP is formed in a Pentile structure including one red subpixel, one blue subpixel, and two green subpixels.

Each of the subpixels SP includes a pixel-driving circuit and a light-emitting element 120 connected to the pixel-driving circuit.

The pixel-driving circuit includes a switching transistor T1, a driving transistor T2, and a storage capacitor Cst. In the present disclosure, a structure in which the pixel-driving circuit includes two transistors T and one capacitor C is described by way of example, but the present disclosure is not limited thereto. That is, a pixel-driving circuit having a 3T1C structure or 3T2C structure in which three or more transistors T and one or more capacitors C are provided may be used.

The switching transistor T1 is turned on when a scan pulse is supplied to a scan line SL, and supplies a data signal supplied to a data line DL to the storage capacitor Cst and a gate electrode of the driving transistor T2.

The driving transistor T2 controls the current I supplied from a high-voltage (VDD) supply line to the light-emitting element 120 in response to the data signal supplied to the gate electrode of the driving transistor T2, thereby adjusting the amount of light emitted from the light-emitting element 120. Even when the switching transistor T1 is turned off, the driving transistor T2 maintains the emission of light by the light-emitting element 120 by supplying a constant amount of current thereto using the voltage charged in the storage capacitor Cst until the data signal of the next frame is supplied.

Figure 4:
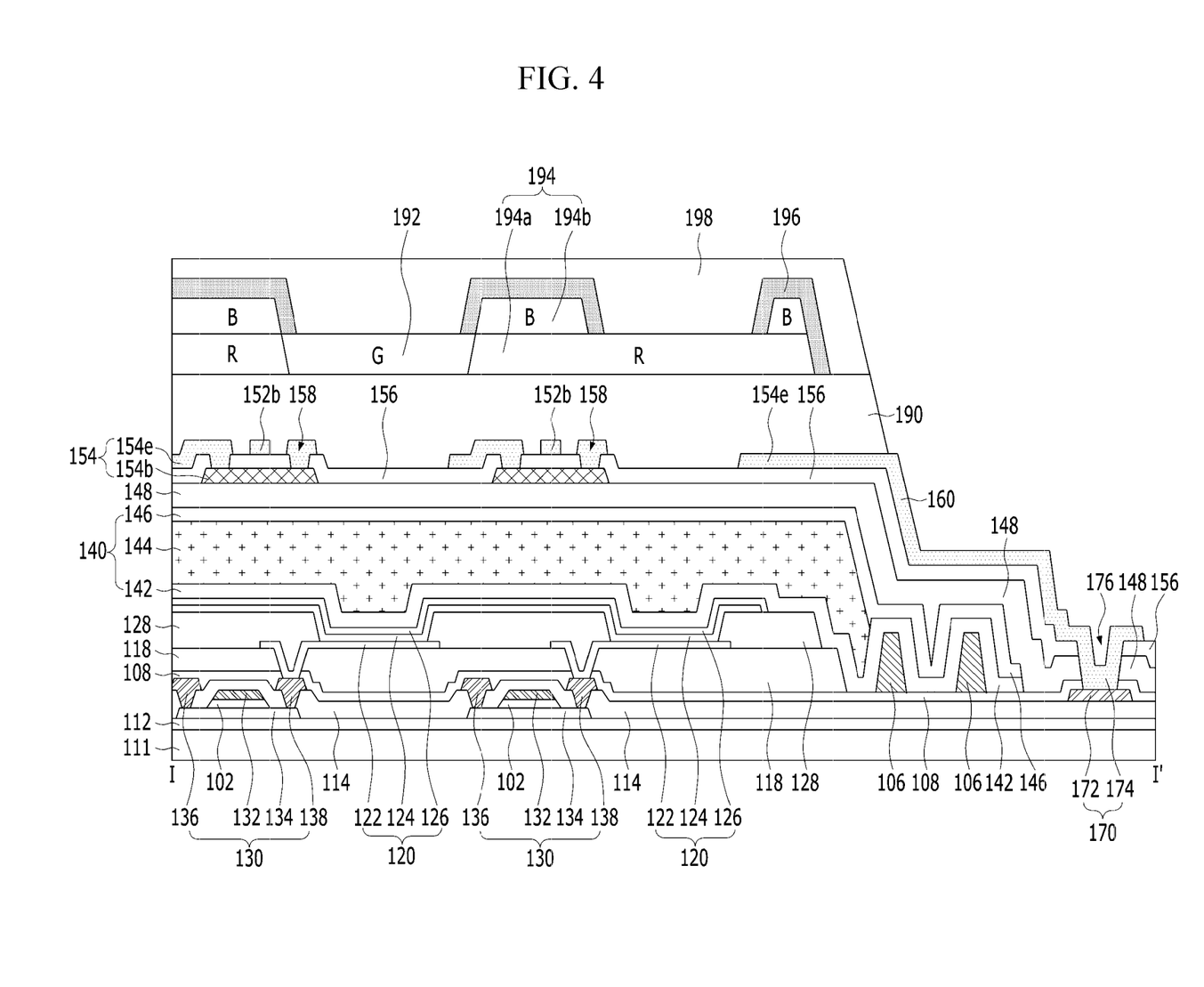
FIG. 4 is a cross-sectional view of the touch display device taken along line I-I' in FIG. 2.

The driving thin-film transistor T2 130, as shown in FIG. 4, includes a semiconductor layer 134 disposed on a buffer layer 112, a gate electrode 132 overlapping the semiconductor layer 134 with a gate insulating film 102 interposed therebetween, and source and drain electrodes 136 and 138 formed on an interlayer insulating film 114 so as to be in contact with the semiconductor layer 134. The semiconductor layer 134 is formed of at least one of an amorphous semiconductor material, a polycrystalline semiconductor material, or an oxide semiconductor material.

The light-emitting element 120 includes an anode 122, a light-emitting stack 124 formed on the anode 122, and a cathode 126 formed on the light-emitting stack 124.

The anode 122 is electrically connected to the drain electrode 138 of the driving thin-film transistor T2 (130), which is exposed through a pixel contact hole that penetrates a pixel planarization layer 118.

At least one light-emitting stack 124 is formed on the anode 122 in an emission area that is defined by a bank 128. The at least one light-emitting stack 124 is formed by stacking a hole-related layer, an organic emission layer, and an electron-related layer on the anode 122 in that order or in the reverse order. In addition, the light-emitting stack 124 may include first and second light-emitting stacks, which face each other with a charge generation layer interposed therebetween. In this case, the organic emission layer of any one of the first and second light-emitting stacks generates blue light, and the organic emission layer of the other one of the first and second light-emitting stacks generates yellow-green light, whereby white light is generated through the first and second light-emitting stacks. Since the white light generated in the light-emitting stack 124 is incident on a color filter located above the light-emitting stack 124, a color image may be realized. Alternatively, colored light corresponding to each subpixel may be generated in each light-emitting stack 124 without a separate color filter in order to realize a color image. That is, the light-emitting stack 124 of the red (R) subpixel may generate red light, the light-emitting stack 124 of the green (G) subpixel may generate green light, and the light-emitting stack 124 of the blue (B) subpixel may generate blue light.

The cathode 126 is formed so as to face the anode 122, with the light-emitting stack 124 interposed therebetween. The cathode 126 is connected to a low-voltage (VSS) supply line.

The encapsulation unit 140 prevents foreign materials including but not limited to external moisture or oxygen from entering the light-emitting element 120, which is vulnerable to external moisture or oxygen. To this end, the encapsulation unit 140 includes a plurality of inorganic encapsulation layers 142 and 146 and an organic encapsulation layer 144 disposed between the plurality of inorganic encapsulation layers 142 and 146. The inorganic encapsulation layer 146 is disposed at the top of the encapsulation unit 140. In this case, the encapsulation unit 140 includes at least two inorganic encapsulation layers 142 and 146 and at least one organic encapsulation layer 144. In the present disclosure, the structure of the encapsulation unit 140 in which the organic encapsulation layer 144 is disposed between the first and second inorganic encapsulation layers 142 and 146 will be described by way of example.

The first inorganic encapsulation layer 142 is formed on the substrate 111, on which the cathode 126 has been formed, at the position that is the closest to the light-emitting element 120. The first inorganic encapsulation layer 142 is formed of an inorganic insulating material that is capable of being deposited at a low temperature, such as silicon nitride ($SiN_x$), silicon oxide ($SiO_x$), silicon oxynitride (SiON), or aluminum oxide ($Al_2O_3$). Thus, since the first inorganic encapsulation layer 142 is deposited in a low-temperature atmosphere, it is possible to prevent damage to the light-emitting stack 124, which is vulnerable to a high-temperature atmosphere, during the process of depositing the first inorganic encapsulation layer 142.

The organic encapsulation layer 144 serves to dampen the stress between the respective layers due to bending of the organic light-emitting display device and to increase planarization performance. The organic encapsulation layer 144 is formed of an organic insulating material, such as acrylic resin, epoxy resin, polyimide, polyethylene, or silicon oxycarbide (SiOC).

When the organic encapsulation layer 144 is formed through an inkjet method, at least one dam 106 is disposed in order to prevent the organic encapsulation layer 144, which is in a liquid state, from spreading to an edge of the substrate 111. The at least one dam 106 may prevent the organic encapsulation layer 144 from spreading to a pad area formed at the outermost portion of the substrate 111, in which a touch pad 170 and a display pad 104 are disposed. To this end, the at least one dam 106 may be formed so as to completely surround the active area, in which the light-emitting element 120 is disposed, as shown in FIG. 2, or may be formed only between the active area and the pad area. When the pad area, in which the touch pad 170 and the display pad 104 are disposed, is disposed at one side of the substrate 111, the at least one dam 106 is disposed only on the one side of the substrate 111. When the pad area, in which the touch pad 170 and the display pad 104 are disposed, is disposed at opposite sides of the substrate 111, the at least one dam 106 is disposed on the opposite sides of the substrate 111. The at least one dam 106 is formed in a single-layered or multi-layered structure. The at least one dam 106 is formed simultaneously with at least one of the pixel planarization layer 118, the bank 128, or the spacer using the same or substantially the same material.

The second inorganic encapsulation layer 146 is formed on the substrate 111, on which the organic encapsulation layer 144 has been formed, so as to cover the top and side surfaces of each of the organic encapsulation layer 144 and the first inorganic encapsulation layer 142. Accordingly, the second inorganic encapsulation layer 146 reduces or prevents permeation of external moisture or oxygen into the first inorganic encapsulation layer 142 and the organic encapsulation layer 144. The second inorganic encapsulation layer 146 is formed of an inorganic insulating material, such as silicon nitride (SiN$_x$), silicon oxide (SiO$_x$), silicon oxynitride (SiON), or aluminum oxide (Al$_2$O$_3$).

A touch sensor Cm is disposed on the encapsulation unit 140. The touch sensor Cm includes a touch insulating film 156, and further includes a touch-sensing line 154 and a touch-driving line 152 disposed so as to intersect each other, with the touch insulating film 156 interposed therebetween. The touch sensor charges an electric charge using a touch-driving pulse supplied to the touch-driving line 152, and discharges the electric charge to the touch-sensing line 154.

The touch-driving line 152 includes a plurality of first touch electrodes 152e and first bridges 152b electrically connecting the first touch electrodes 152e to each other.

The first touch electrodes 152e are spaced apart from each other at regular intervals in an X direction, which is a first direction, on the touch insulating film 156. Each of the first touch electrodes 152e is electrically connected to a neighboring first touch electrode 152e via the first bridge 152b.

The first bridge 152b is disposed on the touch insulating film 156, which is coplanar with the second touch electrode 154e, and thus is electrically connected to the second touch electrode 154e without a separate contact hole.

The touch-sensing line 154 includes a plurality of second touch electrodes 154e and second bridges 154b electrically connecting the second touch electrodes 154e to each other.

The second touch electrodes 154e are spaced apart from each other at regular intervals in a Y direction, which is a second direction, on the touch insulating film 156. Each of the second touch electrodes 154e is electrically connected to a neighboring second touch electrode 154e via the second bridge 154b.

The second bridge 154b is formed on a touch buffer film 148, which is formed of an insulating material. The second bridge 154b is exposed through a touch contact hole 158 that penetrates the touch insulating film 156, and is electrically connected to the first touch electrode 152e.

As shown in FIG. 3, the first and second touch electrodes 152e and 154e and the first bridge 152b are formed in a mesh type such that they do not overlap the emission area of each subpixel SP and overlap the bank 128. The second bridge 154b is formed in a V shape or an inverse V shape so as to avoid overlapping the emission area of each subpixel SP but to overlap the bank 128. Accordingly, it is possible to prevent an aperture ratio and transmissivity from being deteriorated by the first and second touch electrodes 152e and 154e and the first and second bridges 152b and 154b.

The first and second touch electrodes 152e and 154e and the first and second bridges 152b and 154b have higher conductivity than a transparent conductive film, and thus are formed as low-resistance electrodes. The first and second touch electrodes 152e and 154e and the first and second bridges 152b and 154b are formed in a single-layered or multi-layered structure together with routing lines 160 using a touch metal layer formed of a material having high corrosion resistance and acid resistance and excellent conductivity, such as Ta, Ti, Cu, or Mo. For example, the first and second touch electrodes 152e and 154e, the first and second bridges 152b and 154b, and the routing lines 160 are formed in a three-layered structure such as a stack of Ti/Al/Ti, MoTi/Cu/MoTi, or Ti/Al/Mo. Accordingly, the resistances and capacitances of the first and second touch electrodes 152e and 154e, the first and second bridges 152b and 154b, and the routing lines 160 are reduced. As a result, RC delay is reduced, thus improving touch sensitivity.

According to the present disclosure, each of the touch-driving line 152 and the touch-sensing line 154 is connected to a touch-driving unit (not shown) via the routing line 160 and the touch pad 170.

The touch pad 170 is connected to a signal transmission film (not shown), on which the touch-driving unit is mounted. The touch pad 170 is composed of first and second touch pad electrodes 172 and 174.

The first touch pad electrode 172 is disposed on at least one of the substrate 111, the buffer layer 112, or the interlayer insulating film 114, which is disposed below the encapsulation unit 140. The first touch pad electrode 172 is formed of the same or substantially the same material as at least one of a gate electrode 132, a source electrode 136, or a drain electrode 138 of a driving transistor T2 (130) in the same plane, and has a single-layered or multi-layered structure. For example, since the first touch pad electrode 172 is formed of the same or substantially the same material as the source and drain electrodes 136 and 138 and is disposed on the interlayer insulating film 114, the first pad electrode 172 is formed through the same mask process as the source and drain electrodes 136 and 138.

The second touch pad electrode 174 is electrically connected to the first touch pad electrode 172, which is exposed through a pad contact hole 176 that penetrates a pixel protective film 108, the touch buffer film 148, and the touch insulating film 156. Since the second touch pad electrode 174 is formed through the same mask process as the routing line 160, the second touch pad electrode 174 is formed of the same or substantially the same material as the routing line 160 in the same plane.

The second touch pad electrode 174 extends from the routing line 160, and is connected to a signal transmission film (not shown), on which the touch-driving unit is mounted, via an anisotropic conductive film (not shown).

A display pad 104 is also disposed in a non-active area (a bezel), in which the touch pad 170 is disposed. For example, as shown in FIG. 2, display pads 104 may be disposed between touch pads 170, or the touch pads 170 may be disposed between the display pads 178. Alternatively, the touch pad 170 may be disposed at one side of the display panel, and the display pad 104 may be disposed at the opposite side of the display panel. However, the arrangement of the touch pad 170 and the display pad 104 is not limited to the structure shown in FIG. 2, and may be variously changed depending on the design requirements of the display device.

The display pad 104 is formed in a stack structure different from that of the touch pad 170, or is formed in the same stack structure as the touch pad 170, as shown in FIG. 3.

The routing line 160 transmits a touch-driving pulse generated in the touch-driving unit to the touch-driving line 152 through the touch pad 170, and transmits a touch signal from the touch-sensing line 154 to the touch-driving unit through the touch pad 170. Accordingly, the routing line 160 is formed between each of the first and second touch electrodes 152e and 154e and the touch pad 170 to electrically connect each of the first and second touch electrodes 152e and 154e to the touch pad 170. As shown in FIG. 2, the routing line 160 extends from the first touch electrode 152e to at least one of the left side or the right side of the active area AA, and is connected to the touch pad 170. In addition, the routing line 160 extends from the second touch electrode 154e to at least one of the upper side or the lower side of the active area, and is connected to the touch pad 170. This arrangement of the routing line 160 may be variously changed depending on the design requirements of the display device. The routing line 160 is disposed above first and second dams 162 and 164 so as to overlap with the first and second dams 162 and 164.

A color filter array is disposed so as to cover the routing lines 160, the touch electrodes 152e and 154e, and the bridges 152b and 154b.

The color filter array includes a touch planarization layer 190, a color filter 192, a light-blocking stack 194, a low-reflection layer 196, and a touch protective film 198.

The touch planarization layer 190 is formed of an organic insulating material, and flattens the substrate 111, on which the routing lines 160, the touch electrodes 152e and 154e, and the bridges 152b and 154b have been formed.

The color filter 192 is disposed so as to overlap the emission area exposed by the bank 128 of each subpixel area. A red (R) color filter 192 is formed on the touch planarization layer 190 of the red subpixel area, a green (G) color filter 192 is formed on the touch planarization layer 190 of the green subpixel area, and a blue (B) color filter 192 is formed on the touch planarization layer 190 of the blue subpixel area.

The light-blocking stack 194 is disposed so as to overlap the bank 128 between the color filters 192. The light-blocking stack 194 serves to distinguish between the subpixel areas and to prevent optical interference and light leakage between adjacent subpixel areas. In addition, the light-blocking stack 194 is formed such that the reflectivity thereof has a single-digit percentage (%). As such, the light-blocking stack 194 absorbs external light, thereby reducing or minimizing deterioration in visibility and brightness.

Figure 5:
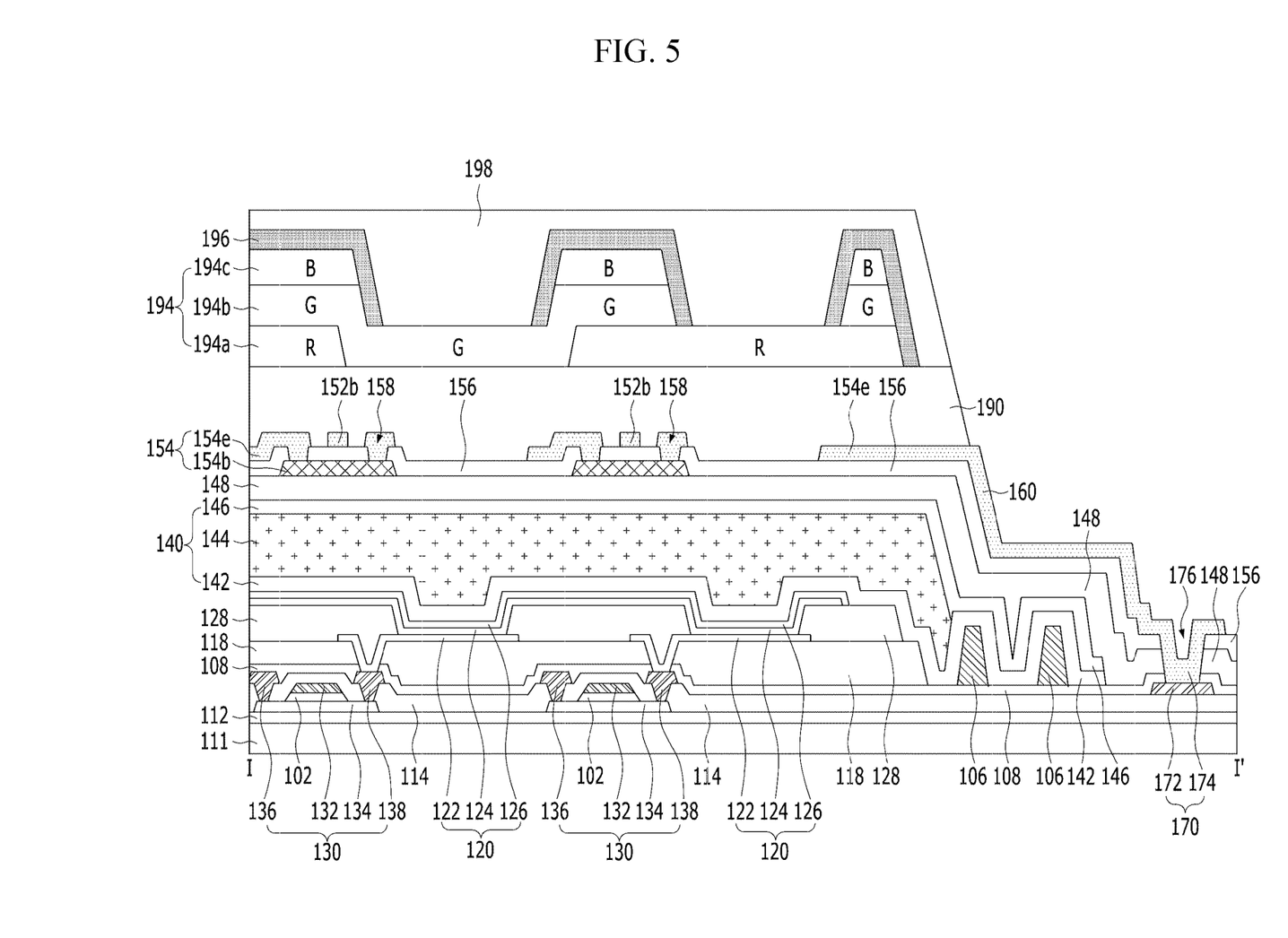
FIG. 5 is a cross-sectional view showing another embodiment of the light-blocking stack shown in FIG. 4.

The light-blocking stack 194 is formed by stacking at least two light-blocking color layers 194a and 194b that realize different colors from each other. That is, the light-blocking stack 194 is formed by stacking first and second light-blocking color layers 194a and 194b, as shown in FIG. 4, or is formed by stacking first to third light-blocking color layers 194a, 194b and 194c, as shown in FIG. 5. The first light-blocking color layer 194a is formed of the same or substantially the same material as any one of the red (R), green (G), and blue (B) color filters 192. Since the second light-blocking color layer 194b is formed of the same or substantially the same material as the color filter 192, which realizes a color different from that of the first light-blocking color layer 194a, the second light-blocking color layer 194b absorbs light that has passed through the first light-blocking color layer 194a, among the light generated by the light-emitting element 120. The third light-blocking color layer 194c is formed of the same or substantially the same material as the color filter 192, which realizes a color different from that of the first and second light-blocking color layers 194a and 194b. The third light-blocking color layer 194c absorbs light that has passed through the first and second light-blocking color layers 194a and 194b, among the light generated by the light-emitting element 120.

For example, in the case of the light-blocking stack 194 having the two-layered structure shown in FIG. 4, since the first light-blocking color layer 194a is formed of the same or substantially the same material as the red (R) or green (G) color filter 192, the first light-blocking color layer 194a is formed through the same mask process as the red (R) or green (G) color filter 192. Since the second light-blocking color layer 194b is formed of the same or substantially the same material as the blue (B) color filter 192, the second light-blocking color layer 194b is formed through the same mask process as the blue (B) color filter 192. In the case of the light-blocking stack 194 having the three-layered structure shown in FIG. 5, the first light-blocking color layer 194a is formed through the same mask process as the red (R) color filter 192 using the same or substantially the same material as the red (R) color filter 192. The second light-blocking color layer 194b is formed through the same mask process as the green (G) color filter 192 using the same or substantially the same material as the green (G) color filter 192. The third light-blocking color layer 194c is formed through the same mask process as the blue (B) color filter 192 using the same or substantially the same material as the blue (B) color filter 192.

As described above, the light-blocking stack 194 of the present disclosure is composed of at least two light-blocking color layers, rather than black resin. In this case, the present disclosure does not use a chemical solution (e.g., a developer), which is used to pattern black resin. Accordingly, in the present disclosure, the second touch pad electrode 174 and the routing line 160 do not react with a chemical solution (a developer), which is used to pattern black resin. Thus, it is possible to prevent corrosion of the second touch pad electrode 174 and the routing line 160. Further, the second touch pad electrode 174 and the routing line 160 have resistance to corrosion by a chemical solution used to pattern the light-blocking stack 194. Thus, it is possible to prevent the second touch pad electrode 174 and the routing line 160 from being corroded by the chemical solution used to pattern the light-blocking stack 194.

Figure 6:
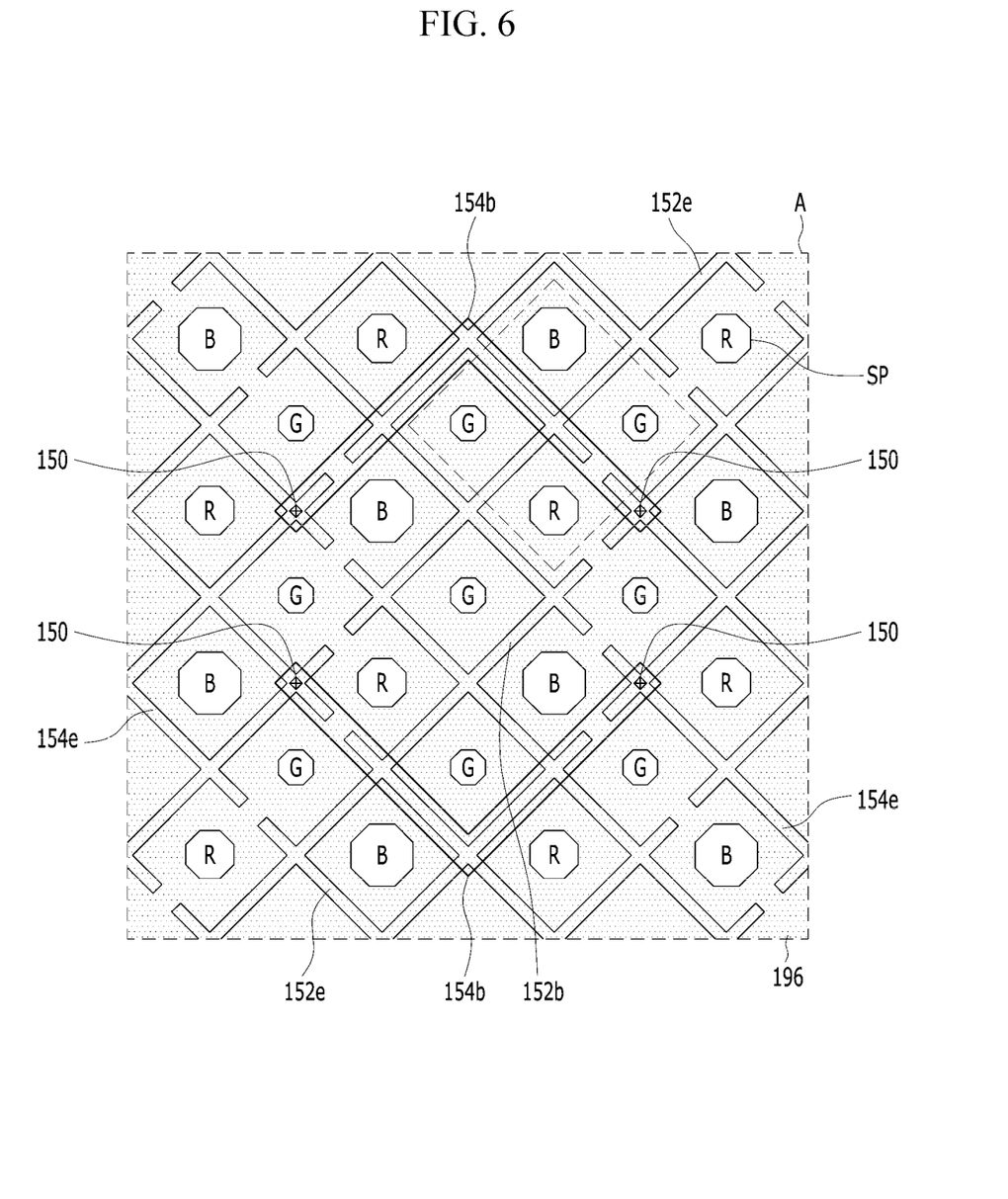
FIG. 6 is a plan view showing the low-reflection layer shown in FIGS. 4 and 5.

As shown in FIG. 6, the low-reflection layer 196 is formed in the region other than the region where the color filter 192 of each subpixel SP is located. That is, since the low-reflection layer 196 is disposed on the light-blocking stack 194 so as to cover the top and side surfaces of the light-blocking stack 194, the low-reflection layer 196 overlaps the touch electrodes 152e and 154e and the bridges 152b and 154b. The low-reflection layer 196 is formed of a low-reflection material having reflectivity having a single-digit percentage (%). For example, the low-reflection layer 196 is formed in a single-layered or multi-layered structure using at least one of $TiO_x$, $CuN_x$, CuMg, CuS, AlON, AlTiN, $MoTaO_x$, or MoTiON. Since the low-reflection layer 196 absorbs external light, it is possible to reduce or minimize deterioration in visibility and brightness.

Figure 7:
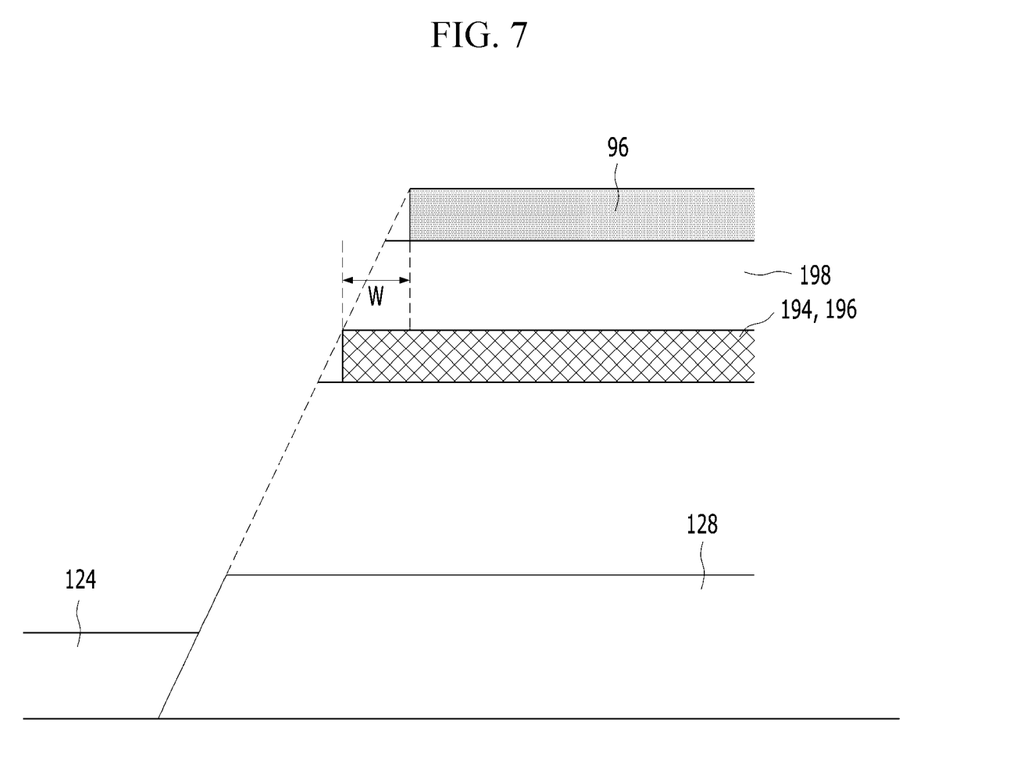
FIG. 7 is a cross-sectional view showing the relationships between the line widths of the light-blocking stack and the low-reflection layer according to the present disclosure and the line width of a polarizing plate according to a comparative example.

As shown in FIG. 7, since the low-reflection layer 196 and the light-blocking stack 194 of the present disclosure are disposed under the touch protective film 198, the spacing distance from the bank 128 is shorter than the spacing distance between the bank 128 and a light-blocking unit 96 of a conventional polarizing plate disposed on the touch protective film 198. In this case, even when the line widths of the low-reflection layer 196 and the light-blocking stack 194 are increased so as to be larger than that of the light-blocking unit 96 of the conventional polarizing plate by 1 to 2 μm, the light generated by the light-emitting element 120 is emitted without being blocked by the low-reflection layer 196 or the light-blocking stack 194. Accordingly, the low-reflection layer 196 and the light-blocking stack 194 of the present disclosure are capable of being formed to be wider than the light-blocking unit 96 of the conventional polarizing plate by a predetermined width W, thereby preventing the occurrence of color mixing and a reduction in viewing angle.

The touch protective film 198 is formed on the substrate 111, on which the touch sensor, the color filter 192, the light-blocking stack 194, and the low-reflection layer 196 have been formed, so as to expose the display pad 104 and the touch pad 170. The touch protective film 198 prevents the touch sensor, the color filter 192, the light-blocking stack 194, and the low-reflection layer 196 from being damaged by external shocks or moisture.

Figure 8:
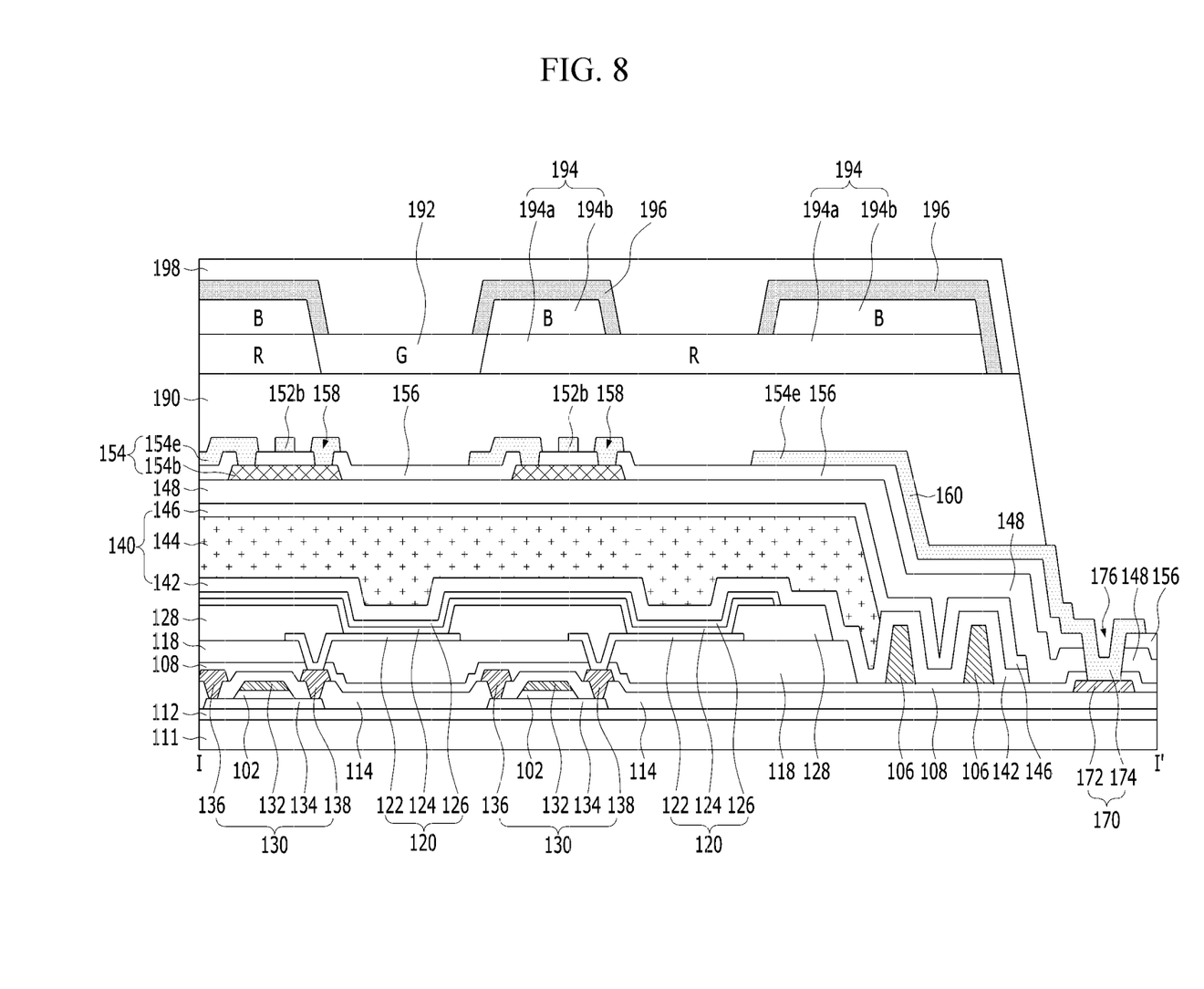
FIG. 8 is a cross-sectional view showing a touch display device according to a second embodiment of the present disclosure.

FIG. 8 is a cross-sectional view showing a touch display device according to a second embodiment of the present disclosure.

The touch display device shown in FIG. 8 includes the same components as the touch display device shown in FIG. 4, except that at least one of a light-blocking stack 194 or a low-reflection layer 196 is disposed on a routing line 160. Thus, a description of the same components will be omitted.

The light-blocking stack 194 is disposed so as to overlap the bank 128 between color filters 192. Further, the light-blocking stack 194 is disposed above the routing line 160 so as to overlap the routing line 160. The light-blocking stack 194 serves to distinguish between the subpixel areas and to prevent optical interference and light leakage between adjacent subpixel areas. In addition, the light-blocking stack 194 is formed such that the reflectivity thereof has a single-digit percentage (%). As such, the light-blocking stack 194 absorbs external light, thereby reducing or minimizing deterioration in visibility and brightness. The light-blocking stack 194 is formed by stacking at least two light-blocking color layers 194a and 194b, which realize different colors from each other.

As described above, the light-blocking stack 194 of the present disclosure is composed of at least two light-blocking color layers 194a and 194b, rather than black resin. In this case, the present disclosure does not use a chemical solution (e.g., a developer), which is used to pattern black resin. Accordingly, in the present disclosure, the second touch pad electrode 174 does not react with a chemical solution (e.g., a developer), which is used to pattern black resin. Thus, it is possible to prevent corrosion of the second touch pad electrode 174.

As shown in FIG. 8, since the low-reflection layer 196 is disposed on the light-blocking stack 194 so as to cover the top and side surfaces of the light-blocking stack 194, the low-reflection layer 196 overlaps the routing line 160, the touch electrodes 152e and 154e, and the bridges 152b and 154b. The low-reflection layer 196 is formed of a low-reflection material having reflectivity having a single-digit percentage (%). For example, the low-reflection layer 196 is formed in a single-layered or multi-layered structure using at least one of $TiO_x$, $CuN_x$, CuMg, CuS, AlON, AlTiN, $MoTaO_x$, or MoTiON. Since the low-reflection layer 196 absorbs external light, it is possible to reduce or minimize deterioration in visibility and brightness.

Although the present disclosure has been described by exemplifying the mutual-capacitance-type touch sensor, which includes the touch-sensing line 154 and the touch-driving line 152 intersecting each other, with the touch insulating film 156 interposed therebetween, the present disclosure may also be applied to a self-capacitance-type touch sensor. Since each of a plurality of self-capacitance-type touch electrodes has electrically independent self-capacitance, it is used as a self-capacitance-type touch sensor, which senses variation in capacitance in response to a user touch. That is, the light-blocking stack 194 and the low-reflection layer 196 are disposed so as to overlap a plurality of self-capacitance-type touch electrodes and the routing line 160. Accordingly, the light-blocking stack 194 and the low-reflection layer 196 absorb external light, thereby reducing or minimizing deterioration in visibility and brightness.

A touch display device according to various embodiments of the present disclosure may be described as follows.

The touch display device according to the present disclosure includes a light-emitting element disposed on a substrate, an encapsulation unit disposed on the light-emitting element, a plurality of touch electrodes disposed on the encapsulation unit, a light-blocking stack including at least two light-blocking color layers overlapping the plurality of touch electrodes, and a low-reflection layer disposed on the light-blocking stack.

In addition, the touch display device according to the present disclosure further includes red, green, and blue color filters overlapping the light-emitting element.

The at least two light-blocking color layers realize different colors from each other.

Specifically, a first embodiment of the at least two light-blocking color layers include a first light-blocking color layer formed of the same or substantially the same material as one of the red and green color filters, and a second light-blocking color layer disposed on the first light-blocking color layer and formed of the same or substantially the same material as the blue color filter.

A second embodiment of the at least two light-blocking color layers include a first light-blocking color layer formed of the same or substantially the same material as the red color filter, a second light-blocking color layer formed of the same or substantially the same material as the green color filter, and a third light-blocking color layer formed of the same or substantially the same material as the blue color filter.

The low-reflection layer is formed in a single-layered or multi-layered structure using at least one of $TiO_x$, $CuN_x$, CuMg, CuS, AlON, AlTiN, $MoTaO_x$, or MoTiON.

In addition, the touch display device further includes a routing line connected to the touch electrodes and disposed along the side surface of the encapsulation unit, and a touch pad connected to the routing line.

In addition, the touch display device further includes a touch protective film disposed on the low-reflection layer and on the substrate in a region other than the region where the touch pad is located. For example, a touch protective film is on the low-reflection layer and on the substrate in a region spaced apart from the touch pad.

At least one of the light-blocking stack or the low-reflection layer overlaps the routing line.

As is apparent from the above description, in a touch display device according to the present disclosure, a light-blocking stack composed of at least two light-blocking color layers realizing different colors from each other and a low-reflection layer disposed on the light-blocking stack are formed so as to overlap at least one of a touch electrode formed of opaque metal, a bridge, or a routing line. Accordingly, it is possible to prevent external light from being reflected by the touch electrode, the bridge, and the routing line, and thus the present disclosure is capable of exhibiting low reflectivity.

In addition, the touch display device according to the present disclosure is capable of exhibiting low reflectivity without a separate polarizing plate, thereby reducing manufacturing costs and preventing a reduction in transmissivity.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A touch display device, comprising:
   a substrate;
   a light-emitting element on the substrate;
   an encapsulation unit on the light-emitting element;
   a plurality of touch electrodes on the encapsulation unit;
   a light-blocking stack including at least two light-blocking color layers overlapping the plurality of touch electrodes;
   a low-reflection layer on the light-blocking stack; and
   red, green, and blue color filters overlapping the light-emitting element,
   wherein the at least two light-blocking color layers include:
      a first light-blocking color layer formed of either a same or substantially the same material as one of the red and green color filters; and
      a second light-blocking color layer on the first light-blocking color layer and formed of either a same or substantially the same material as the blue color filter.

2. The touch display device according to claim 1, wherein the at least two light-blocking color layers realize different colors from each other.

3. A touch display device comprising:
   a substrate;
   a light-emitting element on the substrate;
   an encapsulation unit on the light-emitting element;
   a plurality of touch electrodes on the encapsulation unit;
   a light-blocking stack including at least two light-blocking color layers overlapping the plurality of touch electrodes;
   a low-reflection layer on the light-blocking stack; and
   red, green, and blue color filters overlapping the light-emitting element,
   wherein the at least two light-blocking color layers include:
   a first light-blocking color layer formed of either a same or substantially the same material as the red color filter;
   a second light-blocking color layer formed of either a same or substantially the same material as the green color filter; and
   a third light-blocking color layer formed of either a same or substantially the same material as the blue color filter.

4. The touch display device according to claim 1, wherein the low-reflection layer is formed in either a single-layered or multi-layered structure using at least one of $TiO_x$, $CuN_x$, CuMg, CuS, AlON, AlTiN, $MoTaO_x$, or MoTiON.

5. The touch display device according to claim 1, further comprising:
   a routing line connected to the touch electrodes and disposed along a side surface of the encapsulation unit; and
   a touch pad connected to the routing line.

6. The touch display device according to claim 5, further comprising:
   a touch protective film on the low-reflection layer and on the substrate in a region spaced apart from the touch pad.

7. The touch display device according to claim 5, wherein at least one of the light-blocking stack or the low-reflection layer overlaps the routing line.

8. The touch display device according to claim 5, wherein the encapsulation unit includes a plurality of inorganic encapsulation layers and at least one organic encapsulation layer.

9. The touch display device according to claim 8, wherein at least one of the plurality of inorganic encapsulation layers extends more toward the touch pad than the at least one organic encapsulation layer.

10. The touch display device according to claim 1, further comprising:
    a bank disposed under the encapsulation unit,
    wherein the low-reflection layer overlaps with the bank.

11. The touch display device according to claim 1, further comprising:
    a touch planarization layer disposed between the touch electrode and the light-blocking stack and disposed on the substrate in a region spaced apart from the touch pad.

12. The touch display device according to claim 3, further comprising:
    a routing line connected to the touch electrodes and disposed along a side surface of the encapsulation unit; and
    a touch pad connected to the routing line.

13. The touch display device according to claim 12, further comprising:
    a touch protective film on the low-reflection layer and on the substrate in a region spaced apart from the touch pad.

14. The touch display device according to claim 12, wherein at least one of the light-blocking stack or the low-reflection layer overlaps the routing line.

15. The touch display device according to claim 3, further comprising:
    a bank disposed under the encapsulation unit,
    wherein the low-reflection layer overlaps with the bank.

16. The touch display device according to claim 3, further comprising:
    a touch planarization layer disposed between the touch electrode and the light-blocking stack and disposed on the substrate in a region spaced apart from the touch pad.

* * * * *